(12) United States Patent
Zoller et al.

(10) Patent No.: US 10,608,581 B2
(45) Date of Patent: *Mar. 31, 2020

(54) SOLAR PANEL LOCATION DETECTION SYSTEM AND METHOD

(71) Applicant: Shoals Technologies Group, LLC, Portland, TN (US)

(72) Inventors: Jeremy Jacob Zoller, New Market, AL (US); Eric Joseph Ibarra, Madison, AL (US)

(73) Assignee: SHOALS TECHNOLOGIES GROUP, LLC, Portland, TN (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/403,732

(22) Filed: May 6, 2019

(65) Prior Publication Data

US 2019/0326853 A1   Oct. 24, 2019

Related U.S. Application Data

(63) Continuation of application No. 14/799,351, filed on Jul. 14, 2015, now Pat. No. 10,333,461.

(51) Int. Cl.
*H02S 50/10* (2014.01)
*G01R 19/165* (2006.01)
*H02S 50/00* (2014.01)

(52) U.S. Cl.
CPC ........ *H02S 50/10* (2014.12); *G01R 19/16528* (2013.01); *G01R 19/16533* (2013.01); *H02S 50/00* (2013.01)

(58) Field of Classification Search
CPC .............. H02S 50/10; G01R 19/16528; G01R 19/16533
See application file for complete search history.

(56) References Cited

U.S. PATENT DOCUMENTS

| | | | |
|---|---|---|---|
| 8,271,599 B2* | 9/2012 | Eizips | H02J 3/385 709/206 |
| 8,299,412 B2* | 10/2012 | Pan | G01S 3/7861 250/203.4 |
| 8,853,605 B2* | 10/2014 | Pan | G01S 3/7861 250/203.4 |

(Continued)

*Primary Examiner* — Tri M Hoang
(74) *Attorney, Agent, or Firm* — Bass, Berry & Sims, PLC

(57) ABSTRACT

A system for automatically commissioning a solar panel array comprises a plurality of panel monitoring devices, each panel monitoring device connected between a positive and negative terminal of a solar panel. Each panel monitoring device comprises a switching device, the switching device configurable to disconnect an output from the solar panel. The system further comprises logic configured to automatically obtain a relative position of each panel monitoring device in the system by appointing serially a series of masters from among the panel monitoring devices, each master in turn broadcasting a unique identifier and enabling its output. Each panel monitoring device listens to the masters' broadcasts and stores in memory the unique identifier and information indicating whether the panel monitoring device detected the masters' voltage. The panel monitoring devices determine their respective locations by analyzing the information broadcast by, and the voltage detected from, the masters.

20 Claims, 7 Drawing Sheets

(56) References Cited

U.S. PATENT DOCUMENTS

| | | | | |
|---|---|---|---|---|
| 2008/0147335 A1* | 6/2008 | Adest | ............. | G01D 4/004 |
| | | | | 702/64 |
| 2012/0310427 A1* | 12/2012 | Williams | ............. | G05F 1/67 |
| | | | | 700/287 |
| 2012/0316802 A1* | 12/2012 | Presher, Jr. | ............. | H02J 7/35 |
| | | | | 702/58 |
| 2013/0279410 A1* | 10/2013 | Dublin, III | ............. | H04W 40/02 |
| | | | | 370/328 |
| 2013/0346054 A1* | 12/2013 | Mumtaz | ............. | H02J 3/383 |
| | | | | 703/13 |
| 2014/0077608 A1* | 3/2014 | Nosaka | ............. | G05F 1/67 |
| | | | | 307/77 |
| 2014/0306542 A1* | 10/2014 | Williams | ............. | H02J 3/385 |
| | | | | 307/80 |
| 2014/0318597 A1* | 10/2014 | Khan | ............. | H02S 20/32 |
| | | | | 136/246 |
| 2016/0036235 A1* | 2/2016 | Getsla | ............. | H02J 3/383 |
| | | | | 307/80 |

* cited by examiner

US 10,608,581 B2

SOLAR PANEL LOCATION DETECTION SYSTEM AND METHOD

CROSS-REFERENCE TO RELATED APPLICATION

This application is a continuation of U.S. patent application Ser. No. 14/799,351, filed Jul. 14, 2015, now U.S. Pat. No. 10,333,461.

BACKGROUND AND SUMMARY

Large solar panel fields may comprise many hundreds or many thousands of individual solar panels. Commissioning a solar panel field requires knowing the precise position of each solar panel in the field relative to the other solar panels in the field. The solar panels must be mapped with respect to each other, so that it is known what solar panels share a circuit, are in series, in parallel and the like. Such mapping of the solar panels in a large field can be labor intensive. One way this commissioning is done is by using a bar code reader and scanning individual solar panels and their related panel monitoring devices. Scanning and mapping by hand can take a lot of time and resources.

A system for automatically commissioning a solar panel array comprises a plurality of panel monitoring devices, each panel monitoring device connected between a positive and negative terminal of a solar panel. Each panel monitoring device comprises a switching device, the switching device configurable to disconnect an output from the solar panel. The system further comprises logic configured to automatically obtain a relative position of each panel monitoring device in the system by appointing serially a series of masters from among the panel monitoring devices, each master in turn broadcasting a unique identifier and enabling its output. Each panel monitoring device listens to the masters' broadcasts and stores in memory the unique identifier and information indicating whether the panel monitoring device detected the masters' voltage. The panel monitoring devices determine their respective locations by analyzing the information broadcast by, and the voltage detected from, the masters.

A method according to the present disclosure comprises connecting the panel monitoring device to each of the plurality of solar panels; selecting a panel monitoring device to be a master; connecting the output to the solar panel associated with the master and causing the master to broadcast wirelessly a unique identifier, the broadcast receivable by panel monitoring devices in the field; logging in memory, by the panel monitoring devices that are not the master, the unique identifier broadcast by the master; measuring an output voltage of each panel monitoring device and logging in each panel monitoring device's memory whether the output voltage of that panel monitoring device is greater than a threshold voltage, the panel monitoring devices that detect an output voltage greater than a threshold voltage comprising a first combiner box group; selecting from with the first combiner box group a new master; and repeating these steps until all of the panel monitoring devices in the first combiner box group have logged information sufficient to determine what string each of the panel monitoring devices in the first combiner box group are in.

DETAILED DESCRIPTION

Figure 1:
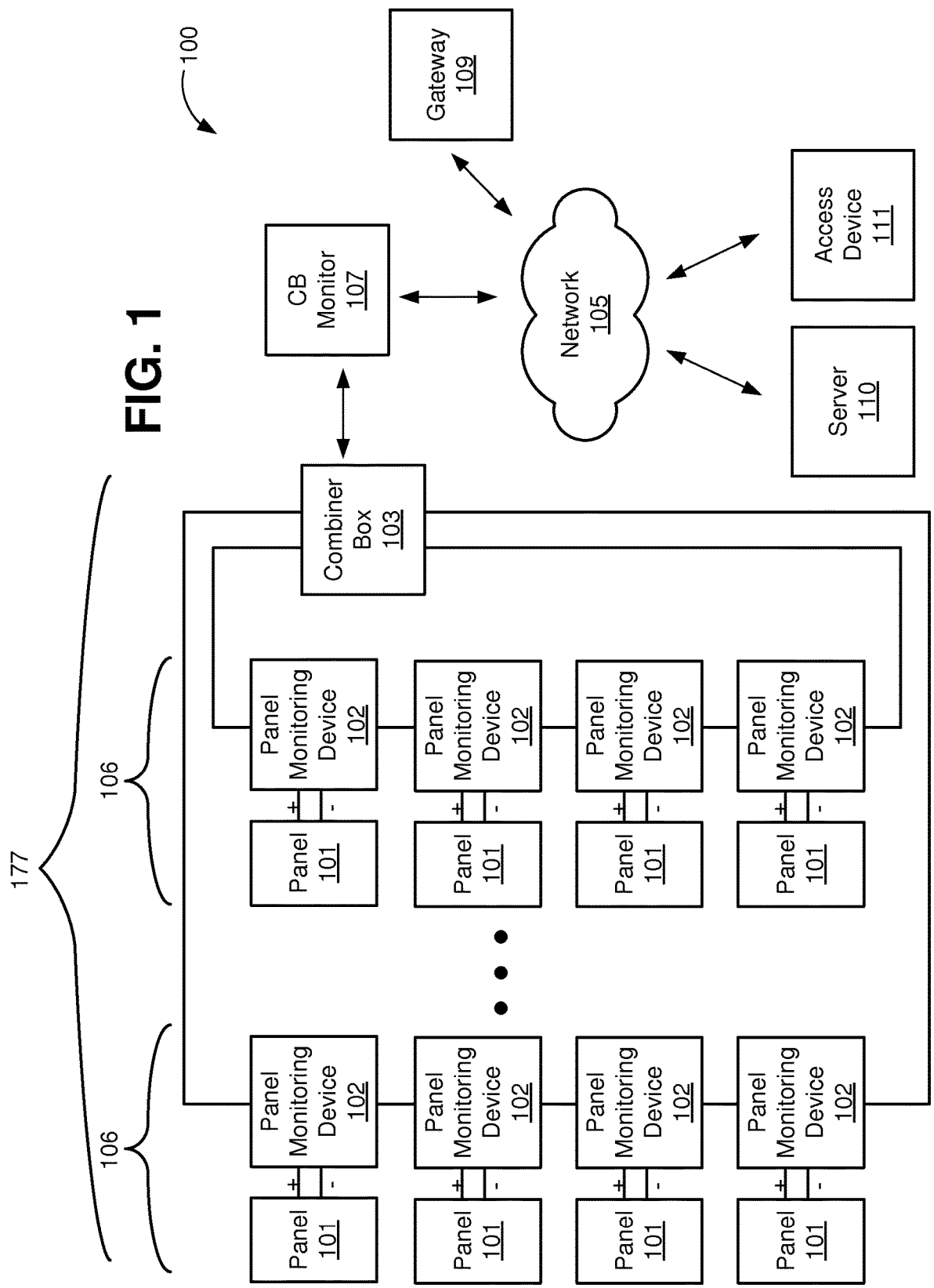
FIG. 1 is a block diagram illustrating a system in accordance with an exemplary embodiment of the present disclosure.

FIG. 1 illustrates a system 100 in accordance with an exemplary embodiment of the present disclosure. The system comprises a plurality of solar panels 101 coupled in series to form into strings 106. A plurality of strings 106 coupled in parallel form an array 177. Although the illustrated embodiment shows four (4) panels 101 in a string 106, and shows two (2) strings 106 in the array 177, the illustration is for explanatory purposes and there may be many more panels 101 in a string 106 and many more strings 106 in an array 177.

A combiner box 103 coupled to the plurality of strings 106 combines the current from the strings 106 into a single combined flow of current that represents a cumulative current from each of the strings 106 of combined panels 101. The combiner box 103 is coupled to an inverter (not shown) that receives the output current, which is DC, and converts the current from DC to alternating current (AC) so that the energy can be applied to a power grid (not shown) for commercial consumption, if desired.

In the illustrated embodiment, a panel monitoring device 102 monitors each panel 101. The panel monitoring device 102 is installed between the positive and negative terminals of the panel 101, so that the panel monitoring device can measure the panel's voltage and current (not shown). The panel monitoring device 102 obtains power for its operation from the solar panel 101.

A combiner box (CB) monitor 107 communicates wirelessly with the panel monitoring devices 102. In the illustrated embodiment, the CB monitor 107 couples with and generally resides inside the combiner box 103. In this regard, the CB monitor obtains power for its operation from the combiner box 103.

The CB monitor 107 collects data generally wirelessly from the panel monitoring devices 102. There may be hundreds of panel monitoring devices 102 that are monitored by one CB monitor 107. In some embodiments, the CB monitor also interfaces electrically with each string 106 so that it can collect voltage and current from the strings 106.

A gateway 109 comprises a router or a proxy server (not shown) that routes signals received from the CB monitor 107 to a server 110. In the illustrated embodiment, neither the CB monitor 107 nor the panel monitoring devices 102 communicate directly with the server 110. Rather, the CB monitor 107 collects data from the panel monitoring devices 102 and communicates that data to the gateway 109. In the illustrated embodiment, the server 110 is offsite from the solar array 177. In other embodiments, the server 110 may be combined with the gateway 109 onsite, or may be onsite and may communicate locally with the gateway 109.

The gateway 109 comprises an internet interface and communicates with the server 110 via the internet. In one embodiment, the communication between the gateway 109 and the CB monitor 107 and panel monitoring devices 102 is via a wireless backhaul network (not shown). In other embodiments, the communication may be via a wired network.

Other embodiments may not include the combiner box 107 and in those embodiments, the panel monitoring devices 102 may communicate directly to the gateway 109. In still other embodiments, the panel monitoring devices 102 may operate independently and communicate directly to the server 110.

During operation, the server 110 further communicates with the access device 111. The access device 111 may be a computer located at, for example, a customer's office (not shown). In this regard, the access device is generally not onsite. Upon request from the access device 111 initiated by a user or customer (not shown), the server 110 may transmit data to the access device 111 for display to the user indicative of the performance of solar panels 101 in the customer's solar array 177. The customer may access the server 110 via a web-based cloud account, for example.

From the access device 111, the user may transmit commands to the server 110 for controlling the panel monitoring devices 102. Thus, the access device 111 remotely interfaces with and performs operations related to the system 100. The access device 111 may be any suitable computer known in the art or future-developed. In one embodiment, the access device 111 is a "thin client" device which depends primarily on the server 110 for processing activities, and focuses on conveying input and output between the user and the server 110. In one embodiment the access device 111 is a personal computer. In other embodiments, the access device 111 is a personal digital assistant (PDA), cellular or mobile phone, radio system, or the like.

In one embodiment, the server 110 comprises a Web Services application (not shown). The Web Service application provides a plurality of Web application program interfaces (APIs) that allow the data access device 111 to perform operations related to the system 100 through the server 110.

The network 105 may be of any type network or networks known in the art or future-developed, such as the internet backbone, Ethernet, IEEE 802.15, IEEE 802.11, WiMax, broadband over power line, coaxial cable, and the like. The network 105 may be any combination of hardware, software, or both.

Figure 2:
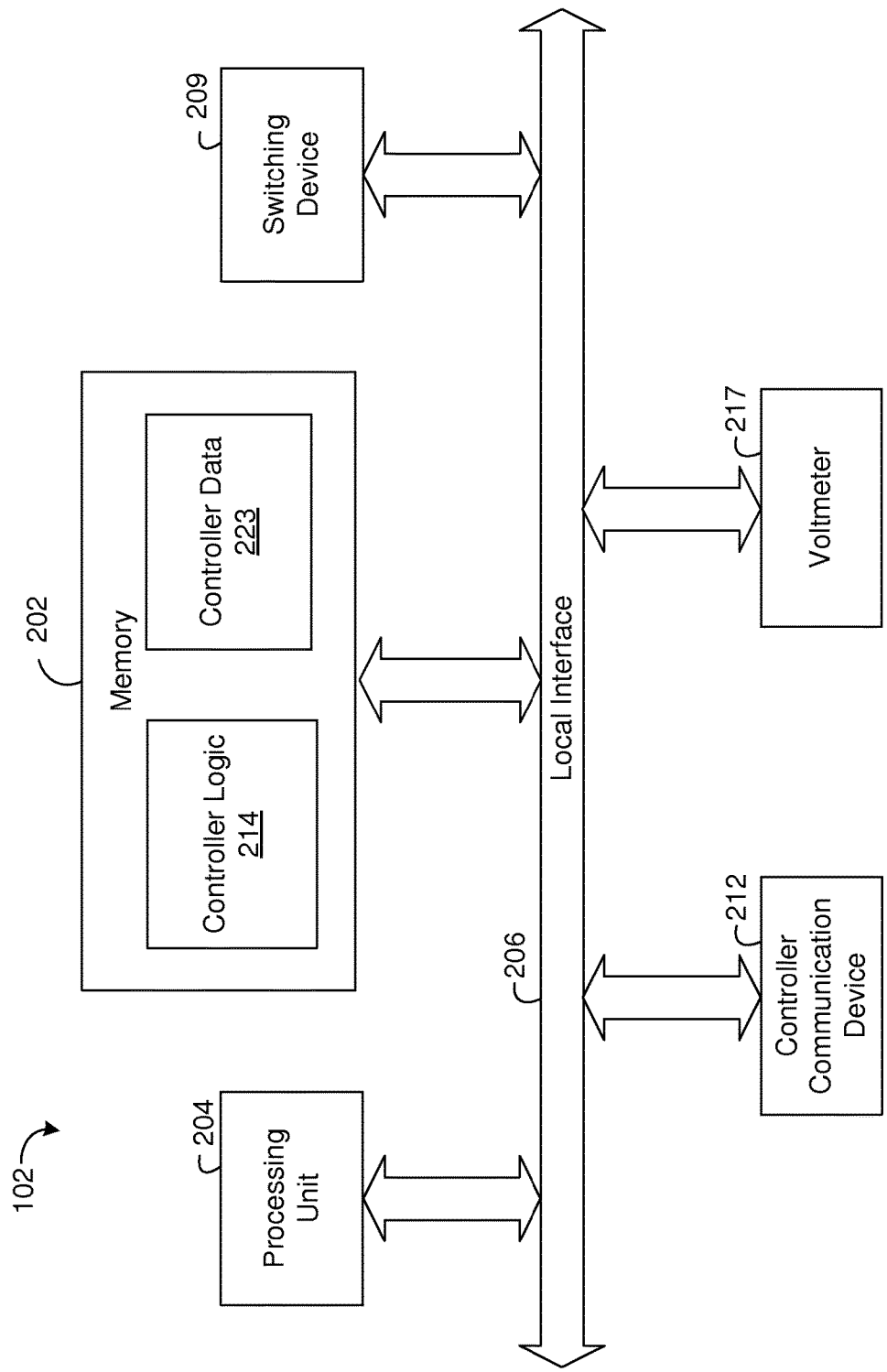
FIG. 2 depicts an exemplary panel monitoring device as depicted in FIG. 1.

FIG. 2 depicts a panel monitoring device 102 of the present disclosure. The exemplary panel monitoring device 102 generally comprises a processing unit 204, a voltmeter 217, a switching device 209, and a controller communication device 212, all communicating over local interface 206.

The panel monitoring device 102 further comprises controller logic 214 and controller data 223. The controller logic 214 and controller data 223 can be software, hardware, or a combination thereof. In the exemplary panel monitoring device 102, the controller logic 214 and controller data 223 are shown as software stored in memory 202. The memory 202 may be of any suitable type of computer memory known in the art, such as RAM, ROM, flash-type, and the like.

As noted herein, the controller logic 214 and the controller data 223 are shown in FIG. 2 as software stored in memory 202. When stored in memory 202, the controller logic 214 and the controller data 223 can be stored and transported on any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium.

The processing unit 204 may be a digital processor or other type of circuitry configured to run the controller logic 214 by processing and executing the instructions of the controller logic 214. The processing unit 204 communicates to and drives the other elements within the panel monitoring device 102 via the local interface 206, which can include one or more buses.

The controller communication device 212 is a device through which the panel monitoring device 102 communicates over the network 105. For example, the communication device 212 may be a Global System for Mobile Communications (GSM) cellular radio port or other type network device, that connects the panel monitoring device 102 with the network 105 for communication with the CB monitor 107 (FIG. 1). The communication device 212 may comprise any number of communications mediums known in the art, for example a wireless solution such as Ethernet, WiMAX, fiber optic, power line carrier (PLC), or the like.

The switching device 209 interfaces with the solar panel 101 (FIG. 1) output (not shown) and controls the solar panel's output during data measurement operations. For example, during operation, the controller logic 214 sends commands to the switching device 209, and in response, the switching device 209 connects and disconnects the solar panel output as needed in the performance of the methods discussed herein. The switching device 209 comprises a plurality of electrical relays, transistors, or other switching devices (not shown).

The switching device 209 may be hardware or a combination of hardware and software. The operation of the switching device 209 may be controlled automatically (via controller logic 214) or remotely through commands sent from the server 110 via the gateway 109 to the CB monitor 107 and to the panel monitoring device 102.

The controller logic 214 also downloads controller data 223 to the CB monitor 107 via the communication device 212. The controller communication device 212 interfaces the panel monitoring device 102 with the network 105 and may comprise software, hardware, or a combination thereof. The controller communication device 212 may consist of, for example, a LAN radio, a WAN radio, an AMPS radio, or other devices suitable for connection to network 105.

The controller logic 214 further communicates with the voltmeter 217. The voltmeter 217 may be hardware, software, firmware, or a combination. The controller logic 214 measures and records the open circuit voltage (not shown) across the solar panel 101 during operation of the system 100, as further discussed herein. The controller logic 214 is further discussed with respect to FIGS. 6a and 6b herein.

The controller data 223 may comprise the solar panel 101 location, the recorded voltage data, the information indicating whether a panel monitoring device 102 has detected voltage from a master PMD (as further discussed herein) and other such data.

Figure 3:
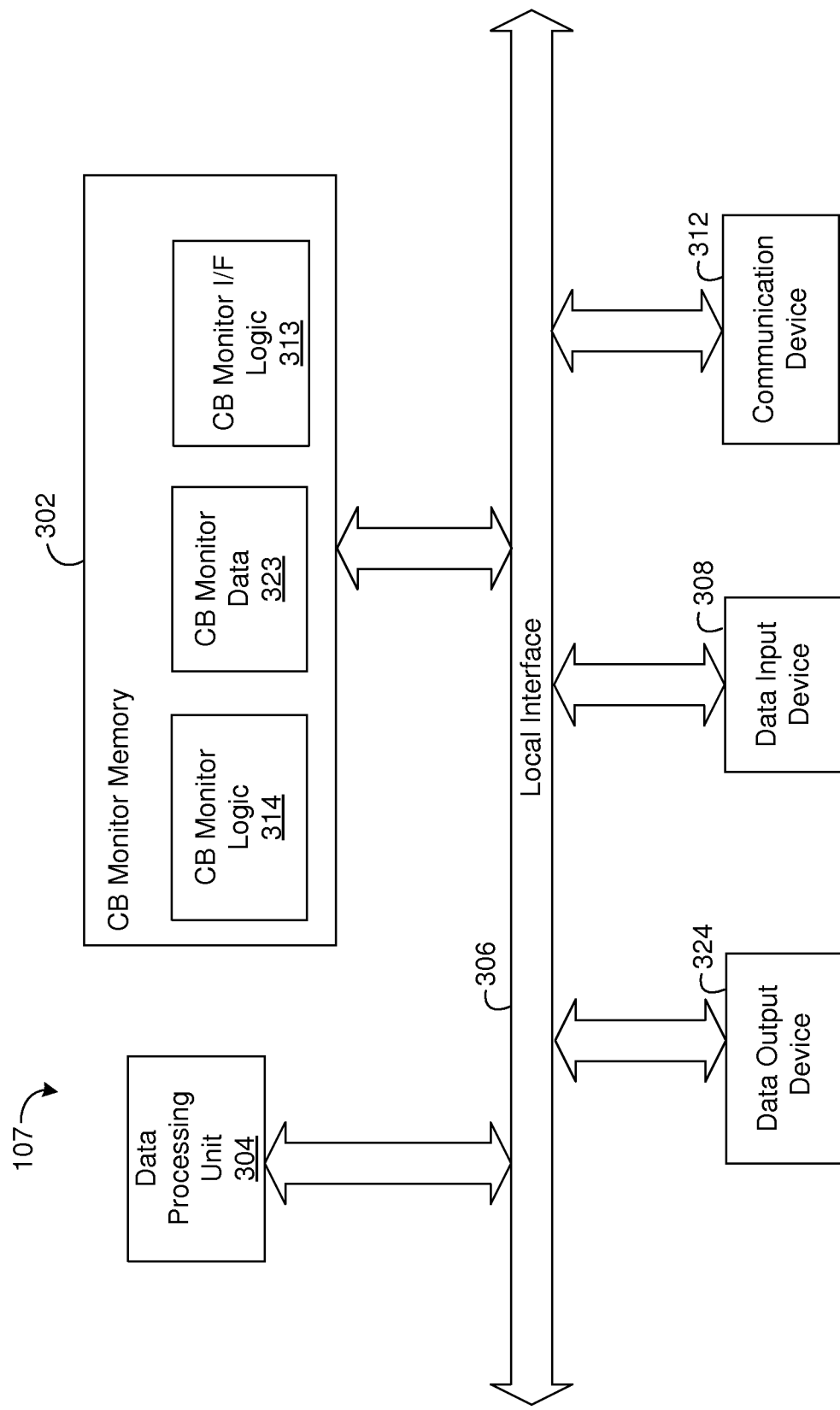
FIG. 3 depicts an exemplary gateway as depicted in FIG. 1.

FIG. 3 depicts an exemplary CB monitor 107 according to the present disclosure. The CB monitor 107 communicates with the panel monitoring devices 102 (FIG. 1) via the network 105. In this regard, the CB monitor 107 receives data from the panel monitoring devices 102 and stores the data as CB monitor data 323.

The CB monitor 107 further communicates with the gateway 109 via the network 105. In this regard, the CB monitor sends and receives data to/from the gateway 109 and stores the data as CB monitor data 323.

The CB monitor 107 generally comprises a data processing unit 304, CB monitor logic 314, CB monitor data 323, and CB monitor interface logic 313. The data processing unit 304 may be a digital processor or other type of circuitry configured to run the CB monitor logic 314 by processing and executing the instructions of the CB monitor logic 414. The data processing unit 304 communicates to and drives the other elements within the CB monitor 107 via a local interface 306, which can include one or more buses.

A data input device 308, for example, a keyboard, a switch, a mouse, and/or other type of interface, can be used to input data from a user (not shown) of the CB monitor. An exemplary data input device 308 may include, but is not limited to, a keyboard device, serial port, scanner, camera, microphone, or local access network connection. An exemplary data output device 324 may include, but is not limited to, a computer display.

The CB monitor data 323 comprises data obtained from the panel monitoring devices 102 that the CB monitor collects and passes on to the gateway 109.

Figure 4:
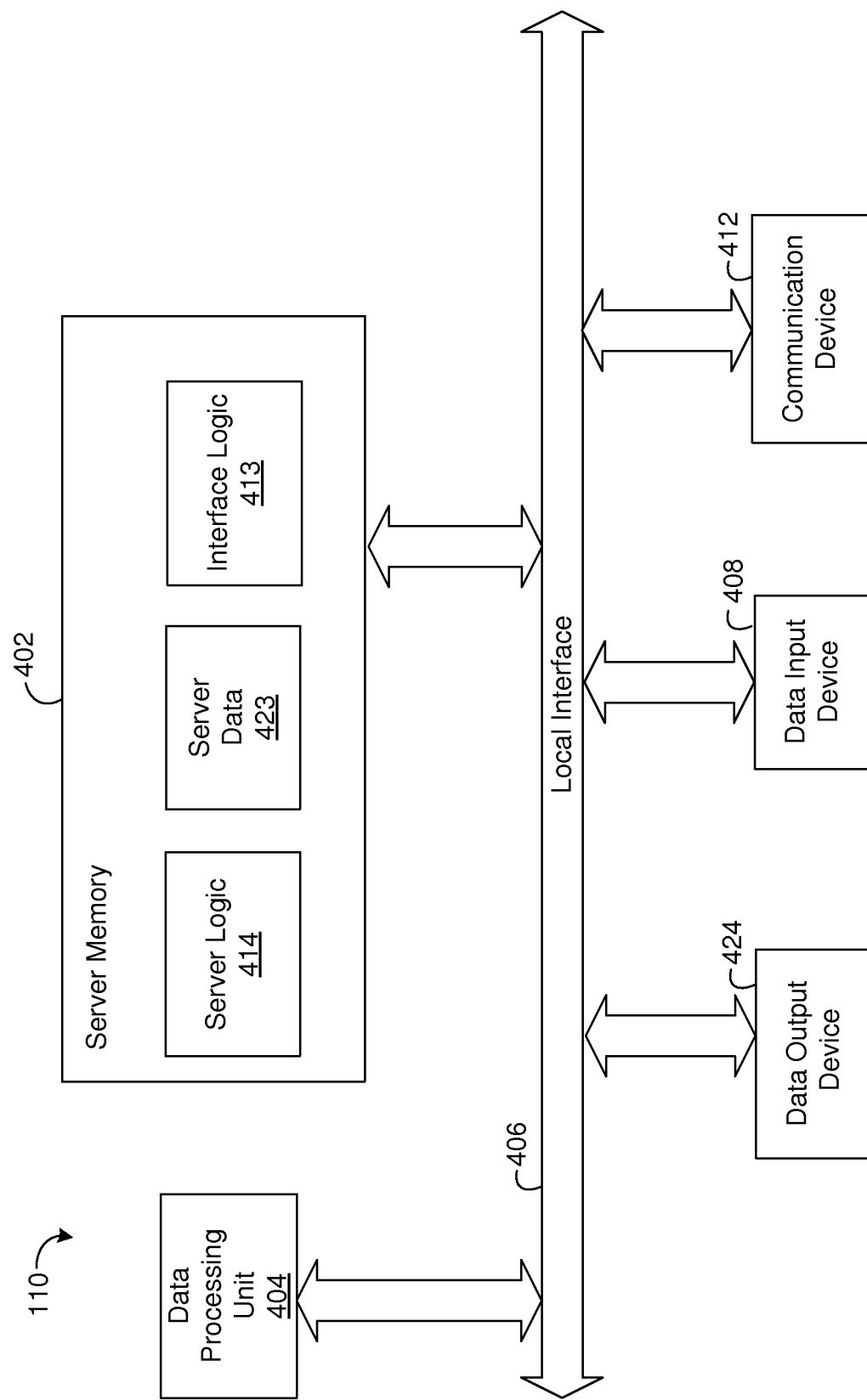
FIG. 4 depicts an exemplary server as depicted in FIG. 1.

In the exemplary CB monitor 107 of FIG. 4, the CB monitor logic 314, CB monitor data 323, and CB monitor interface logic 313 are shown as being implemented in software and stored in CB monitor memory 402. However, the CB monitor logic 314, CB monitor data 323, and CB monitor interface logic 313 may be implemented in hardware, software, or a combination of hardware and software in other embodiments.

In one embodiment of the system 100, the CB monitor logic 314 manages data flow between the panel monitoring devices 102 and the gateway 109. Other embodiments of the system 100 may not use a CB monitor 107 at all.

The CB monitor 107 further comprises CB monitor interface logic 313. During operation of the system 100 (FIG. 1), the CB monitor logic 314 may receive from a gateway 109 a request for information about the array 177 (FIG. 1). The CB monitor logic 314 stores data in CB monitor data 323 indicative of the information request. When such data is stored in CB monitor data 323, the CB monitor interface logic 313 transmits a request to the panel monitoring devices 102. After the CB monitor 107 receives the requested information back from the panel monitoring devices 102, the CB monitor 107 communicates the data to the CB monitor interface logic 313 via communication device 312. Communication device 312 may be a modem, T1 line, router, wireless communication device, or the like. Upon receipt of the relay status data, the CB monitor interface logic 313 stores data indicative of the array status in CB monitor data 323. The CB monitor interface logic 313 translates communications between the gateway 109 and the CB monitor logic 314.

FIG. 4 depicts an exemplary server 110 according to the present disclosure. The server 110 communicates with the gateway 109 via the network 105. In this regard, the server 110 receives data from the gateway 109 and stores the data as server data 423 on the server 110.

The server 110 generally comprises a data processing unit 404, server logic 414, server data 423, and interface logic 413. The data processing unit 404 may be a digital processor or other type of circuitry configured to run the server logic 414 by processing and executing the instructions of the server logic 414. The data processing unit 404 communicates to and drives the other elements within the server 110 via a local interface 406, which can include one or more buses.

A data input device 408, for example, a keyboard, a switch, a mouse, and/or other type of interface, can be used to input data from a user (not shown) of the server 110. An exemplary data input device 408 may include, but is not limited to, a keyboard device, serial port, scanner, camera, microphone, or local access network connection. An exemplary data output device 424 may include, but is not limited to, a computer display.

In the exemplary server 110 of FIG. 4, the server logic 414, server data 423, and interface logic 413 are shown, as indicated above, as being implemented in software and stored in data server memory 402. However, server logic 414, server data 423, and interface logic 413 may be implemented in hardware, software, or a combination of hardware and software in other embodiments. In one embodiment, server logic 414 is software stored in memory 402. Notably, server logic 414 can also be a web service application.

The server logic 414 manages data flow between the gateway 109 and the server 110. In addition, the server logic 414 manages data flow between the access device 111 and the server 110.

The server 110 further comprises interface logic 413. During operation of the system 100 (FIG. 1), the server logic 414 may receive from an access device 111 a request for information about the array 177 (FIG. 1). The server logic 414 stores data in server data 423 indicative of the request. When such data is stored in server data 423, the interface logic 413 transmits a request to the gateway 109 (FIG. 1), and the gateway 109 transmits the request to the CB monitor 107. After the gateway 109 receives the requested information back from the CB monitor, the gateway 109 communicates the information to the interface logic 413 via communication device 412. Communication device 412 may be a modem, T1 line, router, wireless communication device, or the like. Upon receipt of the status data, the interface logic 413 stores data indicative of the information in server data 423. Interface logic 413 translates communications between the gateway 109 and the server logic 414.

Figure 5:
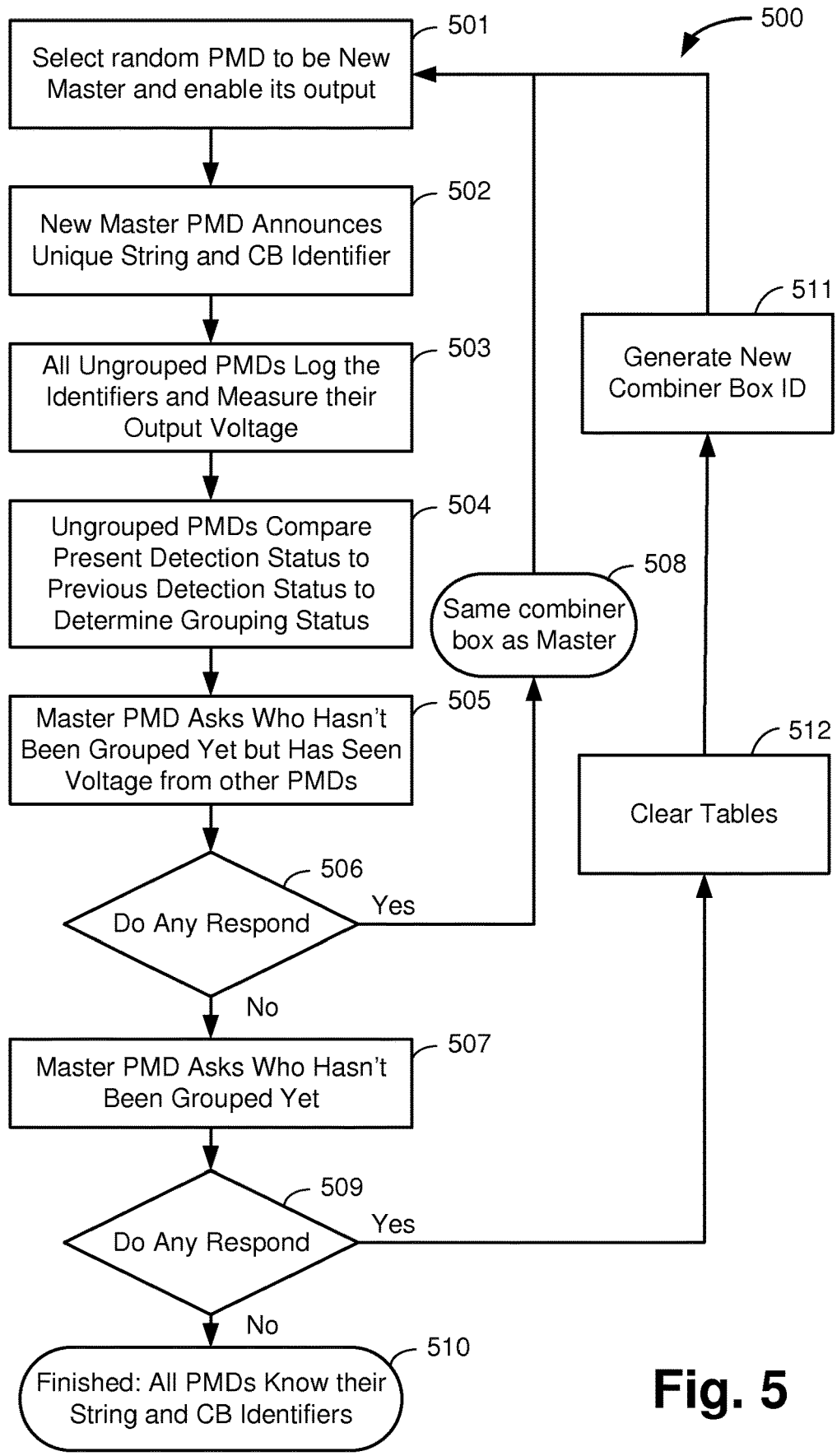
FIG. 5 is a flowchart depicting exemplary architecture and functionality of the system logic in accordance with an exemplary embodiment of the disclosure.

FIG. 5 depicts a method 500 utilizing exemplary architecture and functionality of the system logic (not shown) in accordance with an exemplary embodiment of the disclosure. In step 501 of the method 500, a coordinator selects a random panel monitoring device ("PMD") 102 (FIG. 1) to be the "new master" and the new master PMD enables its output. The coordinator may be a processor (not shown) in the gateway, one of the panel monitoring devices itself, the access device 111 (FIG. 1), or some other computer in the system. At step 501, all of the other panel monitoring devices in the system are in a "listen" mode, with their outputs disconnected.

In step 502, the new master PMD announces a unique combiner box identifier and string identifier. The PMD may be provided the combiner box identifier and string identifier by the coordinator, or may generate the identifiers itself. The combiner box identifier is a unique identifier that will indicate which PMDs are on a particular combiner box 103 (FIG. 1), or on a particular circuit, for circuits that may not have combiner boxes. The string number identifier is a unique identifier that will indicate which PMDs are on a particular string 106 (FIG. 1). The new master PMD broadcasts the unique combiner box identifier and string identifier wirelessly, such that all of the PMDs in the field should be able to receive the broadcast.

In step 503, all PMDs that have not previously been grouped will log the combiner box identifier and string identifier broadcast by the new master. The PMDs will also in this step measure their output voltage. PMDs that are on the same combiner box as the new master PMD, that are not on the same string as the new master PMD, will be able to detect the voltage of the new master PMD. Each PMD will log in a table whether or not the PMD detects the voltage of the new master PMD, as further discussed herein.

In step 504, all ungrouped PMDs compare their present detection status to their previous detection status to determine their grouping status. In this regard, if a PMD detects a voltage above the detection threshold, it knows that it is on the same combiner box as the master at the time of detection. For the PMDs that are on the same combiner box as the master, if the PMD previously did not detect an output voltage (from a previous master), but presently does detect an output voltage (from the new master), the PMD knows that it is on the same string as the previous master. If a PMD previously did detect an output voltage, but presently does not detect an output voltage, then the PMD knows that it is on the same string as the present master.

In this method, each PMD logs in a table its previous detection status and its present detection. Thus it follows that after an initial broadcast/output enabling by the first new master, each PMD would not have a previous status for comparison purposes, and the first actual grouping of PMDs would after the second new master does its initial broadcast/output enabling.

In steps 505 and 506, the new master PMD queries all PMDs and asks for a response from any PMDs who have not previously been grouped, but who now measure voltage above the detection threshold. In step 508, any PMDs who respond to this query are on the same combiner box as the new master.

In steps 507 and 509, the new master PMD queries all PMDs which of them have not been grouped yet. In step 512, if any PMDs respond, all of the PMD tables are cleared, and in step 511, a new combiner box identifier is generated. Step 501 is then repeated for a new master chosen randomly from the PMDs who have not yet been grouped. Steps 501 through 509 are repeated until all PMDs have been grouped.

In step 510, if no PMDs respond to the query of steps 507 and 509, then all PMDs now know their string identifiers and combiner box identifiers, as further discussed herein.

Figure 6A:
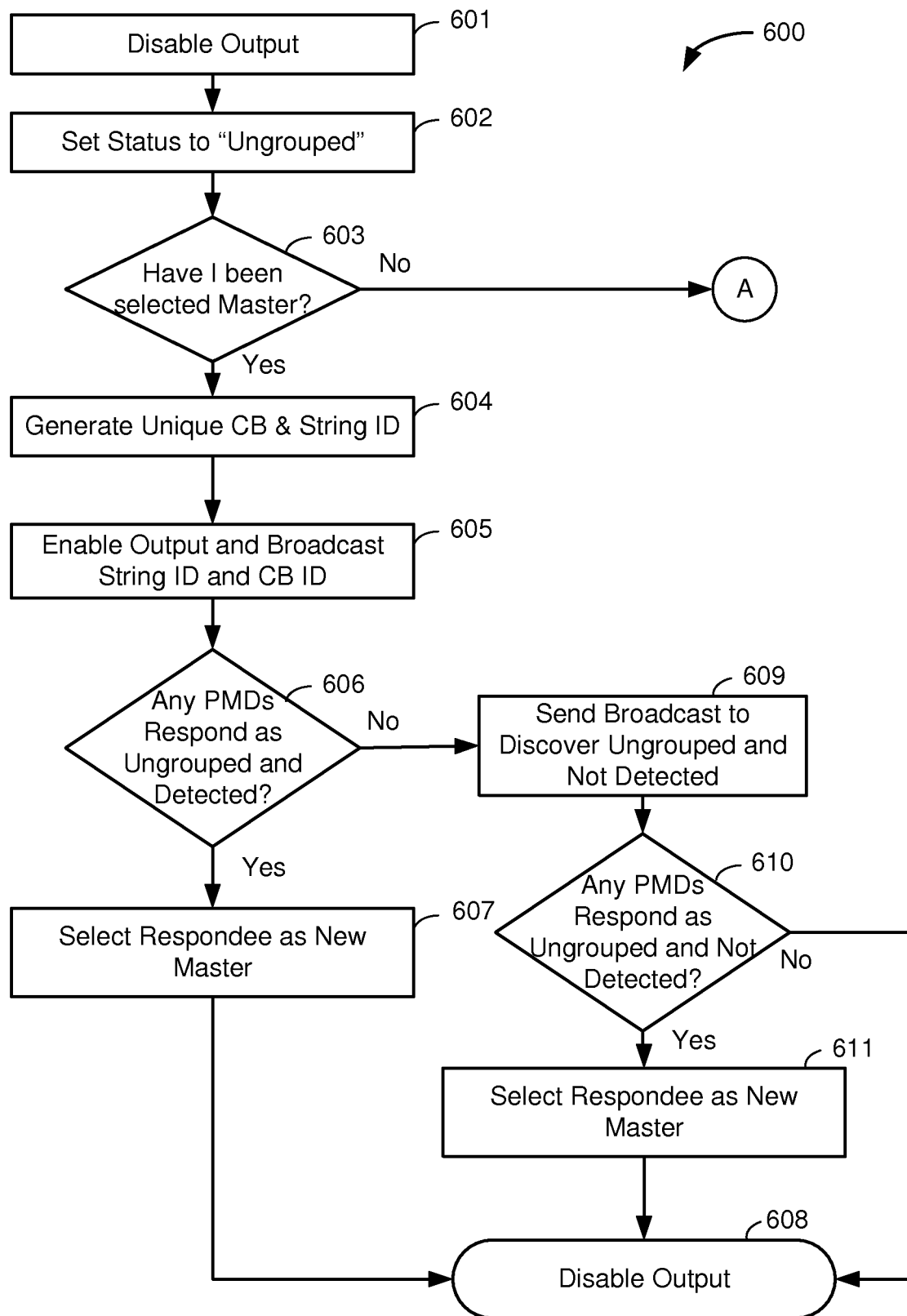
FIGS. 6a and 6b depict a method utilizing exemplary architecture and functionality of the controller logic of the panel monitoring device of FIG. 1, in accordance with an exemplary embodiment of the disclosure.
Figure 6B:
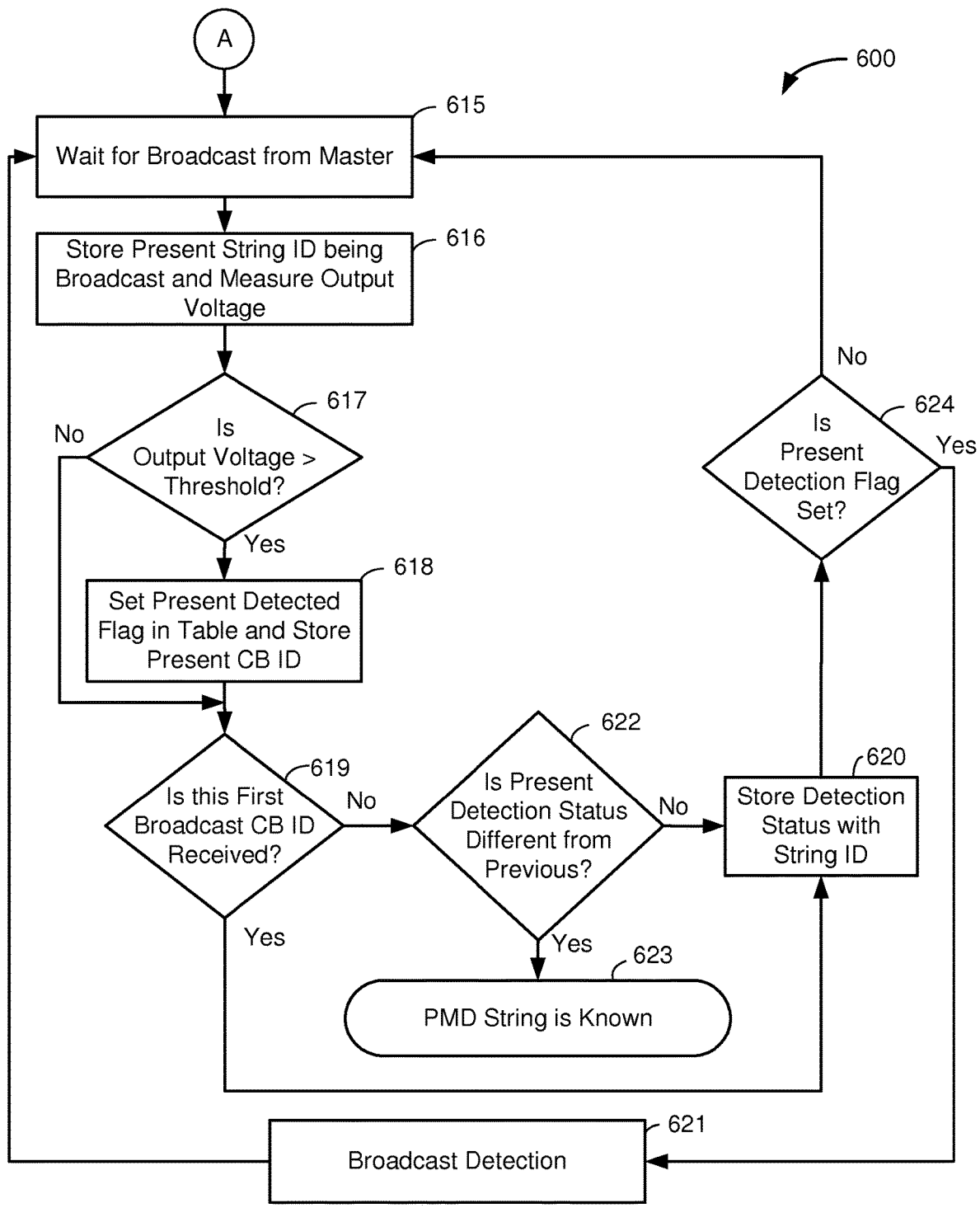

FIGS. 6a and 6b depict a method 600 utilizing exemplary architecture and functionality of the controller logic 214 (FIG. 2) of the panel monitoring device 102 (FIG. 1) in accordance with an exemplary embodiment of the disclosure. The method 600 depicted in FIGS. 6a and 6b is described from the point of view of a single PMD, and in this regard differs from the method 500 of FIG. 5, which depicts a system-level method.

Referring to FIG. 6a, in step 601 of the method 600, the panel monitoring device 102 disables its output. In this regard, the controller logic 214 causes the switching device 209 (FIG. 2) to disconnect the solar panel 101 (FIG. 1) from any external load.

In step 602, the PMD 102 sets its status to "ungrouped." A PMD with a status of "ungrouped" does not know yet which combiner box 103 (FIG. 1) it is on, or what string 106 (FIG. 1) it is on.

In step 603, the PMD 102 "listens" for a broadcast from the present master PMD to see if the PMD has been selected new master. If the PMD 102 has not been selected new master, the method proceeds to step 615 (FIG. 6b). If the PMD 102 has been selected new master, in step 604 the PMD 102 generates (or is provided) a unique combiner box identifier and a string identifier. In step 605, the new master enables its output. In this regard, the controller logic 214 (FIG. 2) causes the switching device 209 to connect the solar panel's external output. The new master then broadcasts the string identifier and combiner box identifier wirelessly. Other PMDs in the field who are on the same combiner box (but not in the same string as the new master) will then be able to detect some portion of the new master PMD's output voltage.

In step 606, the new master PMD then asks if any PMDs who have not been previously grouped detected the new master PMD's voltage. If any PMDs respond that they do detect the voltage, in step 607 the new master will select a random respondee as the new master, and then in step 608, the former new master will disable its output.

Referring back to step 606, if no PMDs respond that they are ungrouped and detected the voltage, then in step 609 the new master sends a broadcast asking if any ungrouped PMDs did not detect the voltage. In step 610, any PMDs who respond in the affirmative are not on the same combiner box as the master and need to be grouped. The master will then select a new master from among these respondees, in step 611, and then disables its output in step 608. If no respondees respond in step 610, that means all of the PMDs have been grouped, and the master disables its output in step 608, and the process has been completed.

In FIG. 6b, step 615, if the PMD has not been selected master (per step 603, FIG. 6a), the PMD waits for a broadcast from the master PMD. In step 616, after the PMD receives a broadcast from the master PMD, the "non-master" PMD stores the string identifier broadcasted by the master PMD. The non-master PMD also measures its output voltage to see if it detects the master PMD.

In step 617, if the output voltage measured by the PMD is over a predetermined threshold, then in step 618, the PMD sets a "voltage detected" flag in a table and stores the combiner box ID broadcasted in the table The predetermined threshold will be chosen based on the voltage of the master panel and the number of panels in a string. In one embodiment, the threshold is two (2) volts. If the output voltage measured by the PMD is not over a predetermined threshold, that means the PMD does not detect the master PMD's voltage.

In step 619, the PMD determines if the broadcast received by the master PMD is the first broadcast the PMD has received. If it is the first broadcast, in step 620, the PMD stores the detection status (yes/no) along with the combiner box identifier and string identifier in the table.

TABLE 1

|  | Master Broadcast | Voltage Detected? |
|---|---|---|
| Present | CB ID #<br>String # | Yes |

Table 1 illustrates a PMD detection table for a PMD that has heard only one broadcast from one master PMD. A "Yes" in the "Voltage Detected?" means that the PMD detected the master PMD's voltage, and that means the PMD is on the same combiner box as the master and on a different string from the master, parallel to the string that the master is in. But the PMD does not know what specific string it is in.

Note that Table 1 shows that the PMD stores both a combiner box ID # and a string ID #. However, in the illustrated method, the combiner box ID# does not necessarily have to be stored, if the location detection is done for one combiner box (for all PMDs on that combiner box) before moving to the PMDs on another combiner box.

Referring back to 619, if the broadcast was not the first broadcast received by the PMD, in step 622, the PMD determines whether the present detection status is different from the previous status. Table 2 below is an exemplary table of a PMD that is not the master PMD, after more than one broadcast has been received by the PMD:

TABLE 2

|  | Master Broadcast | Voltage Detected? |
|---|---|---|
| Previous | CB ID #<br>String # | No |
| Present | CB ID #<br>String # | Yes |

Referring to Table 2, the PMD table keeps up with the PMD's reception of the present broadcast and immediately-previous broadcast of the master PMD. In the Table 2 example, the present detection status (a "yes" in the "Voltage Detected?" column) is different from the previous detection status (a "no" in the "Voltage Detected?" column). If the PMD previously did not detect the previous master's voltage, but now does detect present master's voltage, that means the PMD is on the same combiner box and in the same string as the previous master. That PMD has thus been grouped by combiner box and by string.

If, however, there is a "yes" in both the present and previous rows, then the PMD knows it is on the same combiner box as both the present and previous master, in parallel with both, but does not know which string it is in. It is not until the table has a previous "no" followed by a present "yes," or a previous "yes" followed by a present "no," from two units on the same combiner box that the PMD will know its specific string, because then it knows it is in the same string as the previous master.

Referring back to FIG. 6b, in step 622, if the present detection status is different from the previous, then in step 623, the PMD's string is known. In this regard, if the previous status was "no" and the present status is different from previous (i.e. is "yes"), then the PMD is in the same string as the previous master. Similarly, if the previous status was "yes" and the present status is "no," then the PMD is in the same string as the current master.

If, however, both the "previous" and "present" status was the same, then in step 620, the PMD stores its detection status, along with the string ID. Then, in step 624, the PMD determines if the present detection flag is set (i.e., whether the PMD presently detects the master's voltage). If the PMD detects the present master's voltage, then the PMD proceeds to step 621 and the PMD broadcasts that it detected the voltage from the master, and proceeds to step 615 to await another broadcast.

Referring back to step 624, if the present detection flag is not set (i.e., the PMD does not detect the present master's voltage), then the PMD does not broadcast anything, and proceeds to step 615 to await another broadcast.

This disclosure may be provided in other specific forms and embodiments without departing from the essential characteristics as described herein. The embodiments described are to be considered in all aspects as illustrative only and not restrictive in any manner.

What is claimed is:

1. A method for determining relative positions of solar panels to one another within a solar panel field, the solar panel field having a plurality of solar panels deployed within a communication network, the method comprising:
   receiving, by a non-master and ungrouped solar panel via the communication network, a broadcast from a present master solar panel;
   measuring an output voltage of the non-master and ungrouped solar panel against a predetermined threshold voltage in response to receiving the broadcast;
   determining whether the present master solar panel has been detected by comparing the output voltage and the predetermined threshold voltage;
   determining whether the non-master and ungrouped solar panel has received a previous broadcast by a previous master solar panel and whether the previous master solar panel has been detected; and
   determining a position of the non-master and ungrouped solar panel within the solar panel field based at least upon detection results of the present and previous master solar panels.

2. The method of claim 1, wherein the broadcast of the present master solar panel comprises information indicating a first string identifier and a first combiner box identifier of the present master solar panel, wherein the previous broadcast by the previous master solar panel comprises information indicating a second string identifier and a second combiner box identifier of the previous master solar panel,
   wherein the method further comprises storing, by the non-master and ungrouped solar panel, at least the first and second string identifiers.

3. The method of claim 1, wherein the determining whether the present master solar panel has been detected comprises:
   indicating that the present master solar panel has been detected in response to detecting the output voltage exceeding the predetermined threshold voltage; and
   indicating no detection of the present master solar panel in response to detecting that the output voltage is less than the predetermined threshold voltage.

4. The method of claim 2, wherein the determining the position of the non-master and ungrouped solar panel within the solar panel field comprises:
   assigning the first string identifier and the first combiner box identifier to the non-master and ungrouped solar panel in response to determining that the previous master solar panel has been detected and the present master solar panel has not been detected; and
   assigning the second string identifier and the second combiner box identifier to the non-master and ungrouped solar panel in response to determining that the present master solar panel has been detected and the previous master solar panel has not been detected.

5. The method of claim 1, further comprising:
   storing, by the non-master and ungrouped solar panel, the detection results of the present and previous master solar panels in response to detecting the detection results are the same;
   broadcasting, by the non-master and ungrouped solar panel, that the present master solar panel has been detected when the output voltage exceeds the predetermined threshold voltage; and
   waiting for another broadcast by a new master solar panel.

6. The method of claim 1, further comprising:
storing, by the non-master and ungrouped solar panel, the detection results of the present master solar panel in response to detecting that the broadcast from the present master solar panel is the only broadcast received;
broadcasting, by the non-master and ungrouped solar panel, that the present master solar panel has been detected when the output voltage exceeds the predetermined threshold voltage; and
waiting for another broadcast by a new master solar panel.

7. The method of claim 1, wherein the predetermined threshold voltage is based at least on a voltage of the present master solar panel and a number of solar panels connected in a string.

8. A non-master and ungrouped solar panel in a solar panel field, the solar panel field having a plurality of solar panels deployed within a communication network, the non-master and ungrouped solar panel comprising:
at least one processor configured to:
receive a broadcast via the communication network from a present master solar panel;
measure an output voltage of the non-master and ungrouped solar panel against a predetermined threshold voltage in response to receiving the broadcast;
determine whether the present master solar panel has been detected by comparing the output voltage and the predetermined threshold voltage;
determine whether the non-master and ungrouped solar panel has received a previous broadcast by a previous master solar panel and whether the previous master solar panel has been detected; and
determine a position of the non-master and ungrouped solar panel within the solar panel field based at least upon detection results of the present and previous master solar panels.

9. The non-master and ungrouped solar panel of claim 8, wherein the broadcast of the present master solar panel comprises information indicating a first string identifier and a first combiner box identifier of the present master solar panel, wherein the previous broadcast by the previous master solar panel comprises information indicating a second string identifier and a second combiner box identifier of the previous master solar panel,
wherein the at least one processor is further configured to store at least the first and second string identifiers.

10. The non-master and ungrouped solar panel of claim 8, wherein the at least one processor is further configured to:
indicate that the present master solar panel has been detected in response to detecting the output voltage exceeding the predetermined threshold voltage; and
indicate no detection of the present master solar panel in response to detecting that the output voltage is less than the predetermined threshold voltage.

11. The non-master and ungrouped solar panel of claim 9, wherein the at least one processor is further configured to:
assign the first string identifier and the first combiner box identifier to the non-master and ungrouped solar panel in response to determining that the previous master solar panel has been detected and the present master solar panel has not been detected; and
assign the second string identifier and the second combiner box identifier to the non-master and ungrouped solar panel in response to determining that the present master solar panel has been detected and the previous master solar panel has not been detected.

12. The non-master and ungrouped solar panel of claim 8, wherein the at least one processor is further configured to:
store the detection results of the present and previous master solar panels in response to detecting the detection results are the same;
broadcast that the present master solar panel has been detected when the output voltage exceeds the predetermined threshold voltage; and
wait for another broadcast by a new master solar panel.

13. The non-master and ungrouped solar panel of claim 8, wherein the at least one processor is further configured to:
store the detection results of the present master solar panel in response to detecting that the broadcast from the present master solar panel is the only broadcast received;
broadcast that the present master solar panel has been detected when the output voltage exceeds the predetermined threshold voltage; and
wait for another broadcast by a new master solar panel.

14. The non-master and ungrouped solar panel of claim 8, wherein the predetermined threshold voltage is based at least on a voltage of the present master solar panel and a number of solar panels connected in a string.

15. A non-transitory computer-readable medium storing code executable by at least one processor of a non-master and ungrouped solar panel in a solar panel field, the solar panel field having a plurality of solar panels deployed within a communication network, the code causing the at least one processor to:
receive a broadcast via the communication network from a present master solar panel;
measure an output voltage of the non-master and ungrouped solar panel against a predetermined threshold voltage in response to receiving the broadcast;
determine whether the present master solar panel has been detected by comparing the output voltage and the predetermined threshold voltage;
determine whether the non-master and ungrouped solar panel has received a previous broadcast by a previous master solar panel and whether the previous master solar panel has been detected; and
determine a position of the non-master and ungrouped solar panel within the solar panel field based at least upon detection results of the present and previous master solar panels.

16. The non-transitory computer-readable medium of claim 15, wherein the broadcast of the present master solar panel comprises information indicating a first string identifier and a first combiner box identifier of the present master solar panel, wherein the previous broadcast by the previous master solar panel comprises information indicating a second string identifier and a second combiner box identifier of the previous master solar panel,
wherein the code further causes the at least one processor to store at least the first and second string identifiers,
wherein the predetermined threshold voltage is based at least on a voltage of the present master solar panel and a number of solar panels connected in a string.

17. The non-transitory computer-readable medium of claim 15, wherein the code further causes the at least one processor to:
indicate that the present master solar panel has been detected in response to detecting the output voltage exceeding the predetermined threshold voltage; and
indicate no detection of the present master solar panel in response to detecting that the output voltage is less than the predetermined threshold voltage.

18. The non-transitory computer-readable medium of claim 16, wherein the code further causes the at least one processor to:

assign the first string identifier and the first combiner box identifier to the non-master and ungrouped solar panel in response to determining that the previous master solar panel has been detected and the present master solar panel has not been detected; and assign the second string identifier and the second combiner box identifier to the non-master and ungrouped solar panel in response to determining that the present master solar panel has been detected and the previous master solar panel has not been detected.

19. The non-transitory computer-readable medium of claim 15, wherein the code further causes the at least one processor to:

store the detection results of the present and previous master solar panels in response to detecting the detection results are the same;

broadcast that the present master solar panel has been detected when the output voltage exceeds the predetermined threshold voltage; and wait for another broadcast by a new master solar panel.

20. The non-transitory computer-readable medium of claim 15, wherein the code further causes the at least one processor to:

store the detection results of the present master solar panel in response to detecting that the broadcast from the present master solar panel is the only broadcast received;

broadcast that the present master solar panel has been detected when the output voltage exceeds the predetermined threshold voltage; and wait for another broadcast by a new master solar panel.

* * * * *